United States Patent [19]
Sobhani

[11] Patent Number: 5,342,207
[45] Date of Patent: Aug. 30, 1994

[54] ELECTRICAL INTERCONNECTION METHOD AND APPARATUS UTILIZING RAISED CONNECTING MEANS

[75] Inventor: Mohi Sobhani, Encino, Calif.

[73] Assignee: Hughes Aircraft Company, Los Angeles, Calif.

[21] Appl. No.: 990,475

[22] Filed: Dec. 14, 1992

[51] Int. Cl.$^5$ .............................................. H01R 9/09
[52] U.S. Cl. ........................................ 439/74; 29/846
[58] Field of Search ................. 439/67, 74; 29/830, 29/846, 852, 874, 877, 832

[56] References Cited

U.S. PATENT DOCUMENTS

| | | | |
|---|---|---|---|
| 4,116,517 | 9/1978 | Selvin et al. | 339/17 F |
| 4,125,310 | 11/1978 | Reardon, II . | |
| 4,403,272 | 9/1983 | Larson et al. | 361/398 |
| 4,453,795 | 6/1984 | Moulin . | |
| 4,740,700 | 4/1988 | Shaham et al. | 156/659.1 |
| 4,813,129 | 3/1989 | Karnezos | 29/832 |
| 5,129,142 | 7/1992 | Bindra et al. | 29/852 |
| 5,158,466 | 10/1992 | Schreiber et al. | 29/846 |
| 5,207,585 | 5/1993 | Byrnes et al. | 439/67 |

*Primary Examiner*—Neil Abrams
*Attorney, Agent, or Firm*—M. E. Lachman; M. W. Sales; W. K. Denson-Low

[57] ABSTRACT

A pair of electrical circuits (20, 22), which may be both flexible or one flexible and one rigid, are interconnected by projections, such as bumps (24) and rings (26). The projections are formed from substantially inelastic dielectric material, such as an epoxy, defining bumps (34) and rings (36), which are plated with copper (38). Projections (24, 26) of one circuit are disposed to interconnect with mating projections on the other circuit, the interconnection being bump to bump, bump to ring, or bump to pad. The projections may be formed on a copper-clad substrate (42) or on plated-through holes (72) on a printed wiring board (70). Alternately, polygonal pads (94) on a circuit (90) may be joined to a projection. Further, a plurality of bump projections (106), electrically connected to the same or different circuits, may collectively interconnect with a single oval ring projection (108).

11 Claims, 3 Drawing Sheets

ELECTRICAL INTERCONNECTION METHOD AND APPARATUS UTILIZING RAISED CONNECTING MEANS

BACKGROUND OF THE INVENTION

1. Field of the Invention

The present invention relates to a method and apparatus for interconnecting electrical conductors by use of electrical protuberances, such as raised bumps and rings.

2. Description of Related Art and Other Considerations

There are many techniques for obtaining interconnections among printed wiring boards, and ceramic and silicon wafers. Connectors, which are soldered and aligned to mating connectors, are very expensive. Hand wiring and soldering do not result in cost savings and the high density connections which are increasingly desired in the industry.

Bumps or projecting metallic contacts, as an alternate to soldered and alignable connectors, are known techniques for interconnecting flexible to flexible circuits, flexible to rigid printed circuits, or such circuits to electric components. Examples utilizing such bumps are described in U.S. Pat. Nos. 4,125,310 and 4,453,795. These patents describe a plurality of generally resilient metallic raised projections. In the latter patent, a resilient backup arrangement is used to avoid overstressing and squashing of the resilient contacts or projections beyond their elastic limit, which overstressing precludes repeated mating and unmating of connectors. These terminations otherwise effectively and reliably interconnect mating circuits, but their manufacture can be difficult, time consuming and costly. Many times, repeated etching and plating operations are required. Special attention is often required to select special materials, methodology, tooling and artwork. Many techniques limit the size of the bumps and, therefore, the density of interconnection which is desired.

It is, therefore, desirable to avoid these problems.

SUMMARY OF THE INVENTION

The present invention is directed to enabling the interconnection of a pair of electrical circuits, whether both are flexible or one is flexible and the other is rigid. Electrically conductive material on a first connector is placed on a substrate on which there are sites that define positions of electrical connections. Projections of substantially inelastic dielectric material, e.g., epoxy resin, are affixed to these sites, and an electrically conductive layer is placed atop each of the projections and the electrically conductive material adjacent to the projections.

The inelastic dielectric material must be carefully selected to match its coefficient of thermal expansion with that of the circuit, to have good adhesion to its base material, and not to bubble or expand after it is cured or to burst the underlying copper.

Each of the projections may comprise a rounded mount or a walled structure. The walls are preferably fully enclosed and may be circular, oval or other shape, for example, polygonal. When configured as an enlarged ring or oval, the walled structure may be used to contact a plurality of mounts on a mating cable.

Several advantages are derived from the present invention. It is possible to obtain a higher density interconnection than was previously obtainable. The cost of manufacture is relatively low. Connection and disconnection between mating cables are simple and repeatable. The use of solder connections, special connectors and wired interconnections are avoided. Facile interchangeability amongst different types of flexible or rigid cables and printed wiring boards is obtainable.

Other aims and advantages, as well as a more complete understanding of the present invention, will appear from the following explanation of exemplary embodiments and the accompanying drawings thereof.

DESCRIPTION OF THE PREFERRED EMBODIMENTS

Figure 1:
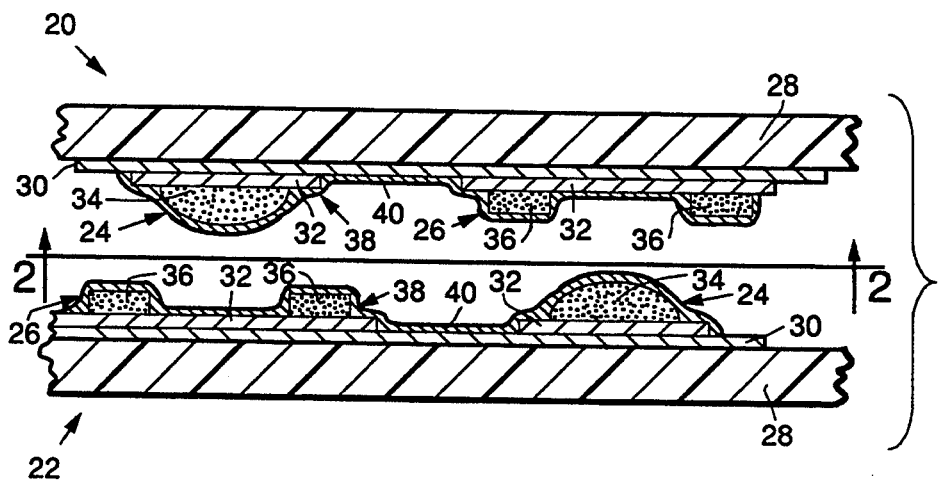
FIG. 1 illustrates, in cross-section, a pair of flexible cables which are interconnectable, in accordance with the teachings of the present invention, using a rounded mount positionable to contact with a ring.
Figure 2:
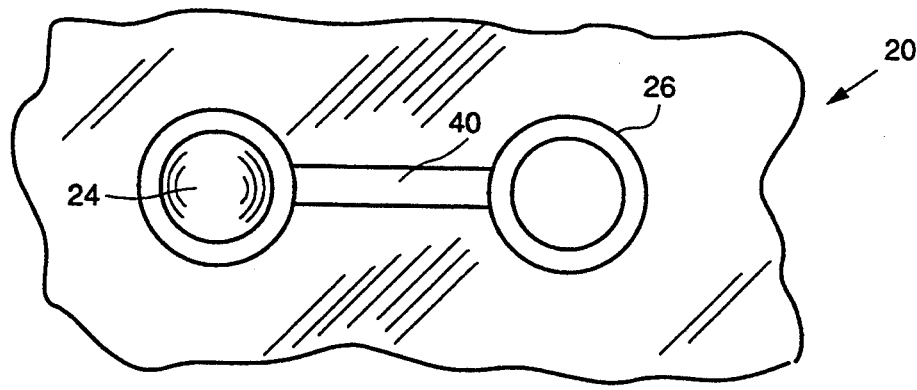
FIG. 2 is a top view of one of the flexible cables depicted in FIG. 1.

As shown in FIGS. 1 and 2, a pair of flexible circuits 20 and 22 each comprise a pair of protuberances configured as bumps 24 and rings 26. Bump 24 of circuit 20 is positioned to face ring 26 of circuit 22, while ring 26 of circuit 20 faces bump 24 of circuit 22. Therefore, when circuits 20 and 22 are placed in contact with one another, their respective bumps and rings form mating interconnections.

Each circuit 20 and 22 is similarly fabricated, and comprises a substrate 28, an electrically conductive layer 30 adhered thereto, electrically conductive pads 32 on layer 30, projections 34 and 36 of relatively inelastic dielectric material, and a conductive layer 38 on the projections.

Substrate 28 may comprise a ceramic or silicon semiconductor, a polyimide plastic, epoxy glass, aluminum nitride, or other suitable electronic material. The material of layer 30, pads 32, and layer 38 may be copper. Pads 32 define the sites of the projecting electrical interconnects, and projections 34 and 36 define respective bump and ring outlines.

While copper layer 38 is shown also to form an interconnection 40 between bumps 24 and rings 26 of respective circuits 20 and 22, it is to be understood that the particular circuit design may not require that such an interconnection 40 exist between every bump and ring pair.

While bumps 24 are depicted as generally circular, they may be configured in any convenient manner. Likewise, rings 26 are illustrated also as circular in configuration; however, they also may be of any other configuration, such as elliptical, oval, and polygonal.

Figure 3:
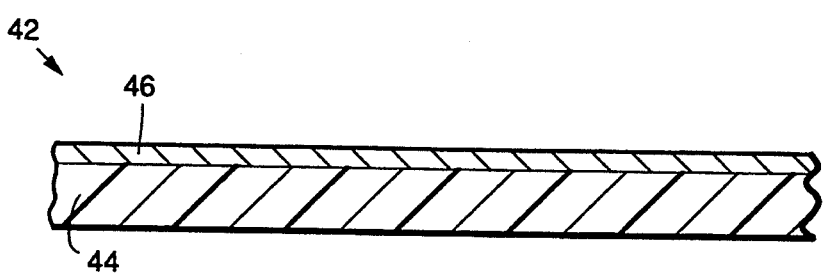
FIGS. 3-9 illustrate a method for forming the bump and ring formations shown in FIGS. 1 and 2.

Each of flexible circuits 20 and 22 are fabricated according to the process depicted in FIGS. 3–9. As shown in FIG. 3, a conventional cladded article 42 of conventional design and construction comprises a substrate 44 having copper cladding 46 distributed thereover. Substrate 44 is formed of any conventional plastic material, e.g., a polyimide plastic.

Figure 4:
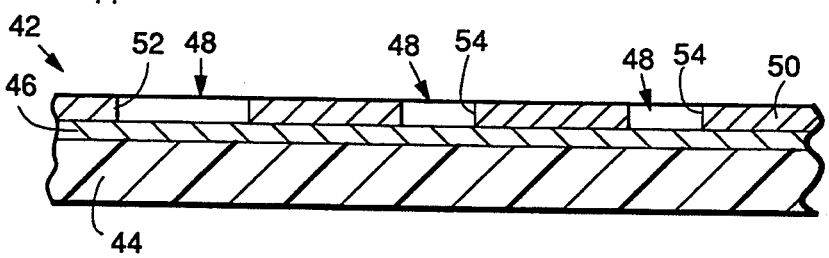

As shown in FIG. 4, sites 48 on article 42 are selected for the formation of respective bumps 24 and rings 26, and are precisely located by the positioning of a screen 50 on copper cladding 46. Screen 50 has openings 52 and 54 therein, which respectively define the sites for bumps 24 and rings 26. For the production of a bump and a ring, opening 52 forms a simple round opening, while opening 54 is angular in shape in order to define the ring.

Figure 5:
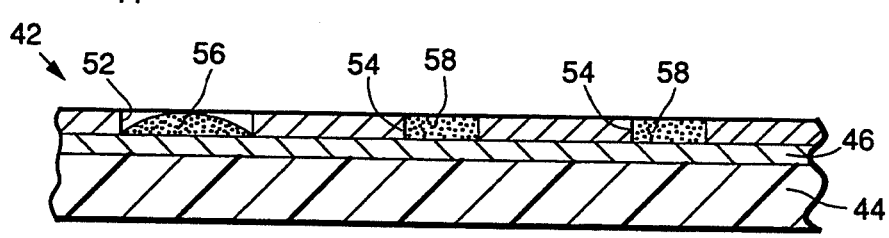

As shown in FIG. 5, a relatively inelastic dielectric material, such as an epoxy resin, is deposited by conventional methods on copper cladding 46 through openings 52 and 54 of screen 50, and thereby respectively forms an epoxy base 56 for bump 24 through opening 52 and an epoxy ring 58 for ring 26 through opening 54.

It is important that the dielectric material have several characteristics. The inelastic dielectric material must be carefully selected to match its coefficient of thermal expansion with that of the circuit, to provide good adhesion to its base material, and not to bubble or expand after it is cured or to burst the underlying copper. Thus, the dielectric material is so selected that its coefficient of thermal expansion be below that of the underlying conductor, for example copper, to prevent any degradation through volume expansion.

The preferred dielectric material comprises a non-metallic epoxy resin, known in the industry as EPON (a trademark of Shell Chemical Company) and more specifically comprises EPON 825, which is essentially pure diglycidyl ether of Bisphenol A, a thermosetting resin, which is chemically activated and heat cured to an irreversible condition. A preferred epoxy composition used in the present invention comprises EPON 825, a curing agent, such as a diamine, and an accelerator. A particular composition used in constructing the present invention comprised EPON 825 and an accelerated amine curing agent comprising menthane diamine (250.0±2.0 parts by weight, pbw), metaphenylene diamine (100.0±2.0 pbw), and N-benzyl dimethylamine (1.5±0.2 pbw) as the accelerator. Optionally, an anhydride curing agent, such as nadic methyl anhydride, may be used. The preferred composition in accordance with the present invention also comprises glass powder, to enable the curing process to be sufficiently rapid, so as to provide an acceptable end item whose geometry can be controlled, and to avoid relaxation and flow of the resin from the desired geometry.

Figure 6:
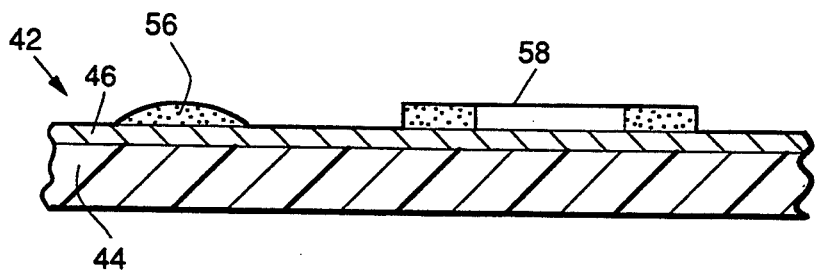

Screen 50 is then removed to present the configuration illustrated in FIG. 6.

Figure 7:
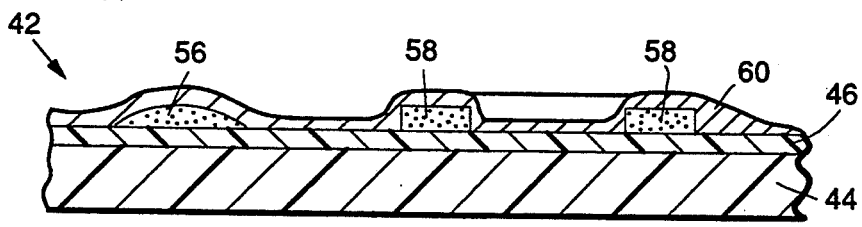

A combination of electroless and electroplated copper 60, as illustrated in FIG. 7, is then deposited by conventional techniques over copper cladding 46 and epoxy projections 56 and 58. As is standard in the industry, an electroless coating is first deposited over the formation depicted in FIG. 6 to insure that copper will cover the dielectric materials comprising projections 56 and 58 as well as cladding 46, the electroless deposit thereby forming an electrically conductive surface for the subsequent deposition of an electroplate of copper.

Figure 8:
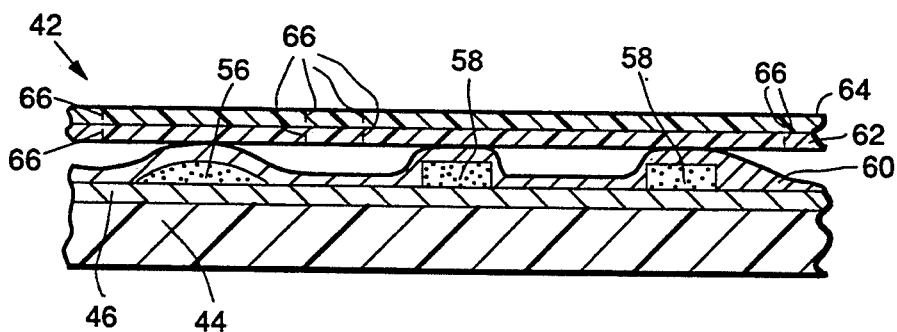
Figure 9:
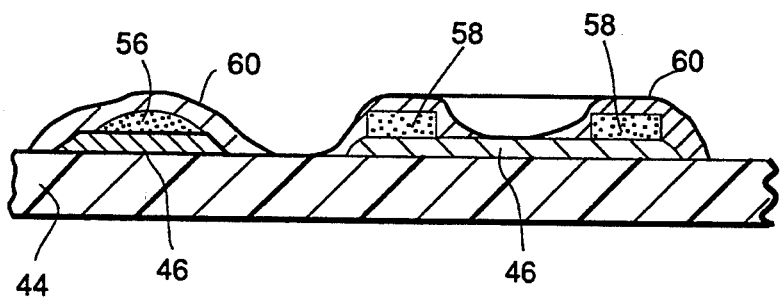

The final definition of the completed circuit is obtained by use of a photoresist 62 and mask/artwork 64 above the photoresist, as illustrated in FIG. 8. Using conventional photographic and etching techniques, which employ photoresist 62 and mask/artwork 64, selective portions of copper cladding 46 and copper plate 60 are etched away, as outlined by the mask and developed photoresist portions designated by indicium 66, thus resulting in the configuration illustrated in FIG. 9, as well as in FIGS. 1 and 2.

Figure 10:
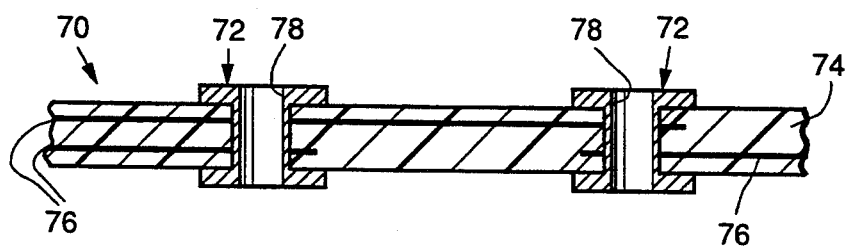
FIGS. 10-12 show an alternate embodiment of the present invention utilizing plated-through holes as bases for the bump or ring interconnects.
Figure 11:
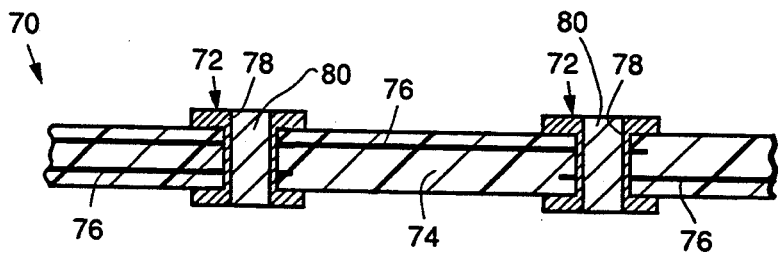
Figure 12:
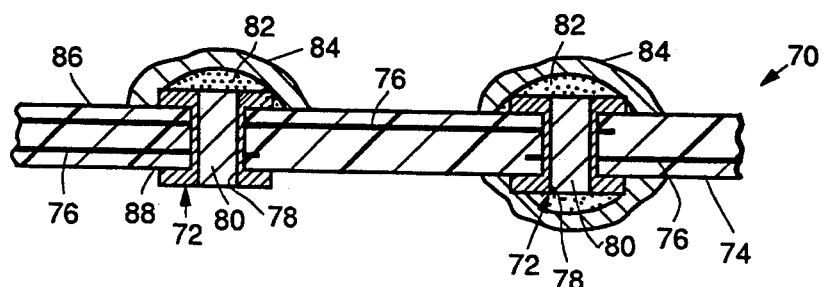

Referring now to FIGS. 10–12, a second embodiment of the present invention relates to projections, such as bumps and rings as above described, formed on a printed wiring board 70 having plated-through holes 72 therein. Such a board with plated-through holes is of conventional construction, board 70 including a matrix 74 of dielectric material and internal conductive traces or leads 76 for connecting one or more plated-through holes 72. As is conventional, plated-through holes 72 are formed with through openings 78 therein.

To form projections on the plated-through holes, as shown in FIG. 11, openings 78 are filled with conductive material 80. Then, by processing similar to that described with respect to FIGS. 3–9, projections 82 of epoxy resin and their coverings of an electroless and electroplated copper plate 84 are formed on the filled plated-through holes, as shown in FIG. 12. While shown as bumps, the projections may be configured as desired and be formed not only on an under surface 86 but also on a lower surface 88 of printed wiring board 70 as depicted in FIG. 12.

Figure 13:
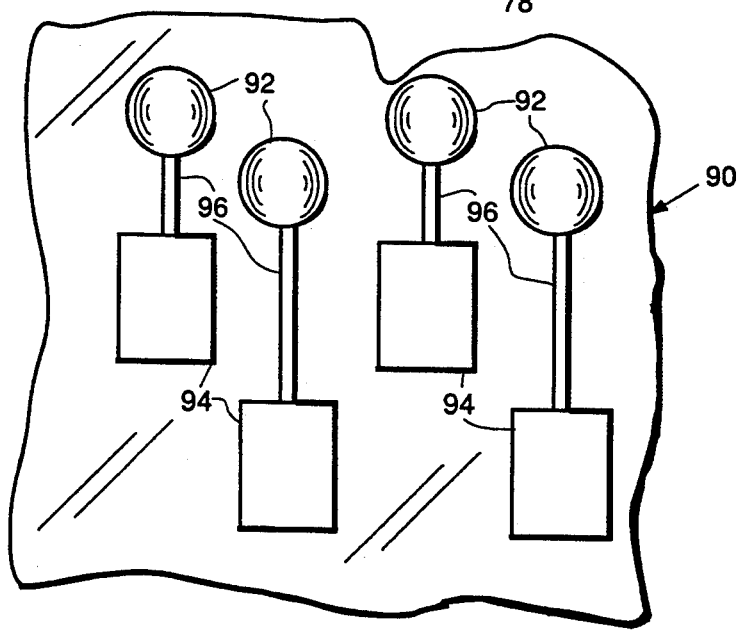
FIG. 13 is a view of a further embodiment of the present invention utilizing a combination of bump projections and flat interconnections for mating, for example, with bump projections on a companion circuit.

Referring now to FIG. 13, a further embodiment of the present invention, comprising a flexible or rigid circuit 90, includes a plurality of projections 92 coupled to rectangular pads 94 by connections 96. While shown as having rectangular configurations, pads 94 may take any polygonal or other configuration. The purpose of pads 94 is to provide a contacting surface of sufficiently large area for contact with one or more projections on a mating circuit.

Figure 14:
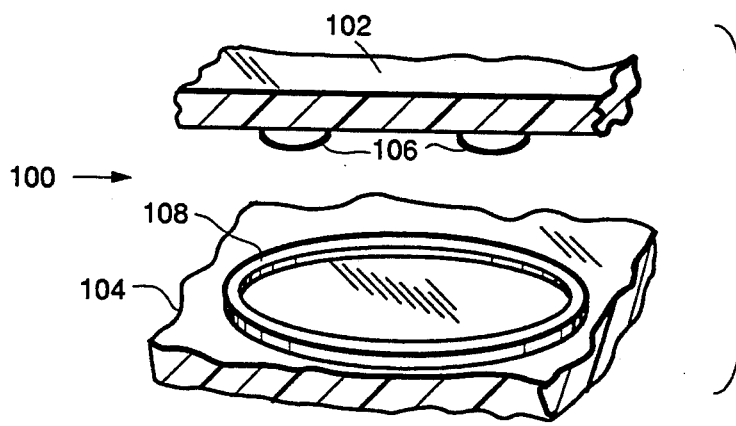
FIG. 14 is a perspective view of still another embodiment of the present invention showing a plurality, illustrated as two, of bump projections contactable with a single oval projection on a mating connector.

In FIG. 14, a circuit assembly 100 is shown as comprising a pair of circuits 102 and 104. The two circuits are interconnected by means of bump projections 106 and a ring projection 108. Both projections 106 and 108 are formed in the manner described above with respect to FIGS. 3–9, or may comprise the plated-through hole configuration depicted in FIGS. 10–12. Ring projection 108 preferably is ovular in configuration and is sufficiently large in area so as to encompass both bump projections 106. While shown as only two bump projections, projections 106 may comprise more than two. In this embodiment, the plurality of bump projections 106 may be all interconnected with one another, in order to insure that there would be at least one electrical connection with oval ring projection 108. Alternately or in addition, the plurality of bump projections 106 may lead to different circuitry and other connections on circuit 102, in order to utilize ring projection 108 to connect the several bump projections and their respective circuits on circuit 102.

Although the invention has been described with respect to particular embodiments thereof, it should be realized that various changes and modifications may be made therein without departing from the scope of the invention.

What is claimed is:

1. An electrical connector adapted to interconnect with a mating electrical connector comprising:
   a substrate;

electrically conductive material on said substrate having sites defining positions of electrical interconnections;

electrically insulative projections comprising walls of substantially inelastic dielectric material affixed to and projecting from said sites; and an electrically conductive layer on and supported by each of said projections and on and electrically coupled to said electrically conductive material adjacent thereto, said conductively layered walls formed as conductively layered enclosures which are sized and shaped to mate and electrically interconnect with a plurality of conductively layered projections formed on said mating electrical connector.

2. An electrical connector according to claim 1 in which said projections consist of a material whose coefficient of thermal expansion matches that of said substrate, which provides good adhesion to said conductive material and layer, and which resists bubbling or expansion after it is cured, which resists bursting said conductive material and layer, and which resists any degradation through volume expansion.

3. An electrical connector according to claim 1 in which said substantially inelastic dielectric material comprises an epoxy resin.

4. An electrical connector according to claim 1 in which said enclosure is configured as a ring.

5. An electrical connector adapted to interconnect with a mating electrical connector comprising:
a substrate;
electrically conductive material on said substrate having sites defining positions of electrical interconnections;
electrically insulative projections of substantially inelastic dielectric material affixed to and projecting from said sites; and
an electrically conductive layer on and supported by each of said projections and on and electrically coupled to said electrically conductive material adjacent thereto;
said conductively layered projections comprising conductively layered walls wherein said walls comprise enclosures which are sized and shaped to mate with a plurality of conductively layered projections on said mating electrical connector.

6. An electrical connector according to claim 5 in which at least one of said conductively layered enclosures is configured as an oval for enclosing at least two of said plurality of conductively layered projections.

7. A method for enabling interconnection of a first electrical connector with a mating electrical connector comprising the steps of:
for the first connector, placing electrically conductive material on a substrate having sites defining positions of electrical interconnections;

affixing electrically insulative projections comprising walls of substantially inelastic dielectric material to the sites;

placing an electrically conductive layer on and supported by each of the projections and on and electrically coupled to the electrically conductive material adjacent thereto;

providing the mating electrical connector with electrically conductive pads having areas disposed to mate with at least respective ones of the projections having the electrically conductive layers thereon; and sizing and shaping the walls as enclosures with the conductive layer thereon which are thereby matable and elec-trically interconnectable with a plurality of the conductively layered projections on the mating electrical connector.

8. A method according to claim 7 further comprising the step of using for the projections a material whose coefficient of thermal expansion matches that of the substrate, which provides good adhesion to the conductive material, and which resists bubbling or expansion after it is cured, which resists bursting the conductive material, and which resists any degradation through volume expansion.

9. A method according to claim 7 in which said sizing and shaping step comprises the step of forming the projections on the mating electrical connector as mating mounts and a ring.

10. A method for enabling interconnection of a first electrical connector with a mating electrical connector comprising the steps of:
for the first connector, placing electrically conductive material on a substrate having sites defining positions of electrical interconnections;
affixing electrically insulative projections of substantially inelastic dielectric material to the sites;
placing an electrically conductive layer on and supported by each of the projections and on and electrically coupled to the electrically conductive material adjacent thereto;
providing the mating electrical connector with electrically conductive pads having areas disposed to mate with at least respective ones of the layered projections having the electrically conductive layers thereon; and
forming the projections and their layers as conductively layered walls by configuring at least one of the walls as an enclosure with the conductive layer thereon which is sized and shaped to mate with a plurality of conductively layered projections on the mating electrical connector.

11. A method according to claim 10 in which said forming step comprises the step of configuring the plurality of conductively layered projections on the mating electrical connector as a plurality of rounded conductively layered mounts, and configuring the conductively layered enclosure as a conductively layered oval for enclosing the plurality of conductively layered rounded mounts.

* * * * *